United States Patent
Richter et al.

[11] 4,091,272
[45] May 23, 1978

[54] INFRA-RED REMOTE CONTROLLED COMMAND SYSTEM FOR A COMMUNICATIONS RECEIVER

[75] Inventors: Heinz Richter, Kronach; Heinz Peetz, Seibelsdorf, both of Germany

[73] Assignee: Loewe-Opta GmbH, Kronach, Germany

[21] Appl. No.: 703,273

[22] Filed: Jul. 7, 1976

[30] Foreign Application Priority Data

Jul. 10, 1975 Germany .............................. 2530812

[51] Int. Cl.² .................................... H04B 9/00
[52] U.S. Cl. ..................................... 250/199; 358/194
[58] Field of Search ......................... 250/199; 358/194

[56] References Cited

U.S. PATENT DOCUMENTS

| | | | |
|---|---|---|---|
| 3,924,120 | 12/1975 | Cox, III | 250/199 |
| 3,928,760 | 12/1975 | Isoda | 250/199 |

*Primary Examiner*—Richard Murray

[57] ABSTRACT

An arrangement for effectively excluding the effects of disturbance pulses in the operation of an infra-red remote control system (e.g., for channel switching of a television receiver) is described. Facilities are provided on the transmitting side of the remote control arrangement for encoding the pulse interval of a chain of pulses derived from a quartz crystal-controlled oscillator with the intelligence contained in a selected one of a plurality of command signals for the channel switching function. The resulting encoded pulses are converted into a form suitable for modulating a high-frequency chain of pulses from the same oscillator so that the infra-red transmitter emits intelligence in extremely short-duration bursts of energy. The occurrence of the first pulse of the received train of modulated intelligence at the remote-control receiver triggers the generation of a sequence of pulses corresponding to the interval-encoded pulses derived from the oscillator in the transmitter, such latter pulses being generated by a second quartz crystal-controlled oscillator. An additional chain of window-forming pulses are derived from the second oscillator. Such latter pulses appear ideally at the times of occurrence of the pulses in the transmitted encoded sequence from the infra-red sending element; and upon verification that the window-forming pulses and the received pulse sequence coincide, the received pulse sequence is employed to encode the interpulse interval of the pulse sequence derived from the second oscillator. Such PCM-encoded pulse sequence contains the intelligence encoded on the corresponding pulse sequence in the transmitter, and may then be decoded at the receiver to provide a channel switching function in accordance with the original selected command signal.

14 Claims, 7 Drawing Figures

INFRA-RED REMOTE CONTROLLED COMMAND SYSTEM FOR A COMMUNICATIONS RECEIVER

BACKGROUND OF THE INVENTION

The invention relates to remote command systems for regulating a prescribed function in a communication receiver, and more particularly to an infra-red remote command system for effecting a channel switching or other regulation function of a television receiver.

In a known arrangement of this type, a channel switching or other command signal selected by a person operating the sending portion of the remote control apparatus is effective to encode a carrier signal generated by the transmitter by providing a plurality of pulses of varying intervals corresponding to the intelligence of the command signal. Such encoded signal is transmitted, via an infra-red sending element such as a gallium arsenide diode, to a corresponding detecting element (e.g., a silicon photodiode) on the TV receiver. The circuitry associated with the command reproduction portion of the remote-control receiver then decodes the intelligence contained in the received signal to yield a definite number of pulses, which may then be applied to a stepping switch associated with the channel switching element of the receiver.

A disadvantage of known arrangements of this type is that they are susceptible to spurious operation of the reproducing portion thereof as a result of the detection of spurious infra-red signals. Such spurious signals may be produced, e.g., by infra-red sound transmission devices located in the vicinity of the remote control channel switching apparatus.

SUMMARY OF THE INVENTION

Such disadvantage is overcome with the disturbance suppression facilities constructed in accordance with the invention for use in a remote command system for regulating a prescribed function, such as channel switching, of at least one communication receiver in accordance with one of a plurality of selected commands.

In an illustrative embodiment, the transmitting and receiving portions of the command system are provided with identical frequency-controlled oscillators. Dividing circuitry provided in the transmitter is coupled to the associated controlled oscillator for generating a base pulse sequence, of 50% duty factor, at a rate corresponding to a fixed sub-multiple of the oscillator frequency. A PCM encoder in the transmitter codes the interpulse interval of the base pulse sequence, and the output of the encoder is employed, in conjunction with additional dividing circuits coupled to the controlled oscillator, to define a regular sequence, at the base pulse rate, of extremely short duration pulses that are applied to the gallium arsenide transmitter for radiation to the receiving portion.

At the receiver, the detection of the first pulse of the radiated pulse sequence triggers on an additional dividing circuit associated with the second frequency-controlled oscillator to commence the generation of a chain of 50% duty cycle pulses at the base rate, identical to the base pulse sequence at the transmitter. Additional dividing circuits coupled to the second oscillator are adapted to generate, at the base pulse rate, a succession of "window" pulses having a width slightly greater than the transmitted width of each pulse in the sequence from the transmitter, such window pulses being chosen to occur ideally at the times of occurrence of the pulses in the transmitted chain.

The detected pulse sequence from the transmitter is compared, in a suitable coincidence circuit, with the chain of window pulses, and upon verification of their identity the verified information-containing pulse chain is employed to encode the interpulse interval of the regenerated base pulse sequence at the receiver. In the event of a lack of correspondence of the chain of window-forming pulses and the incoming pulse stream (occurring, e.g., during the transmission of disturbance pulses from an extraneous source), the receiver portions of the remote command system are reset to discard the current word.

The encoded information contained in the pulse interval-modulated sequence of regenerated base pulses is identical to that contained in the transmitted pulse stream, so that the regenerated base pulses may be conventionally decoded to produce a number of pulses necessary to arrive at the channel corresponding to the originally selected command signal.

In one feature of the invention, the interpulse spacing of the base pulse sequence is encoded in binary form, with each interpulse interval being switched between the normal base pulse interval and a multiple (illustratively 2) of the base pulse interval.

Additional dividing circuits may be associated with the frequency controlled oscillators in both the transmitter and the receiver for generating word-framing pulse sequences at intervals long with respect to the base pulse interval. Such word pulses are employed, e.g., for providing resetting functions for various counters and shift registers in the remote command system.

BRIEF DESCRIPTION OF THE DRAWING

The invention is further set forth in the following detailed description taken in conjunction with the appended drawing in which.

DETAILED DESCRIPTION

Figure 1:
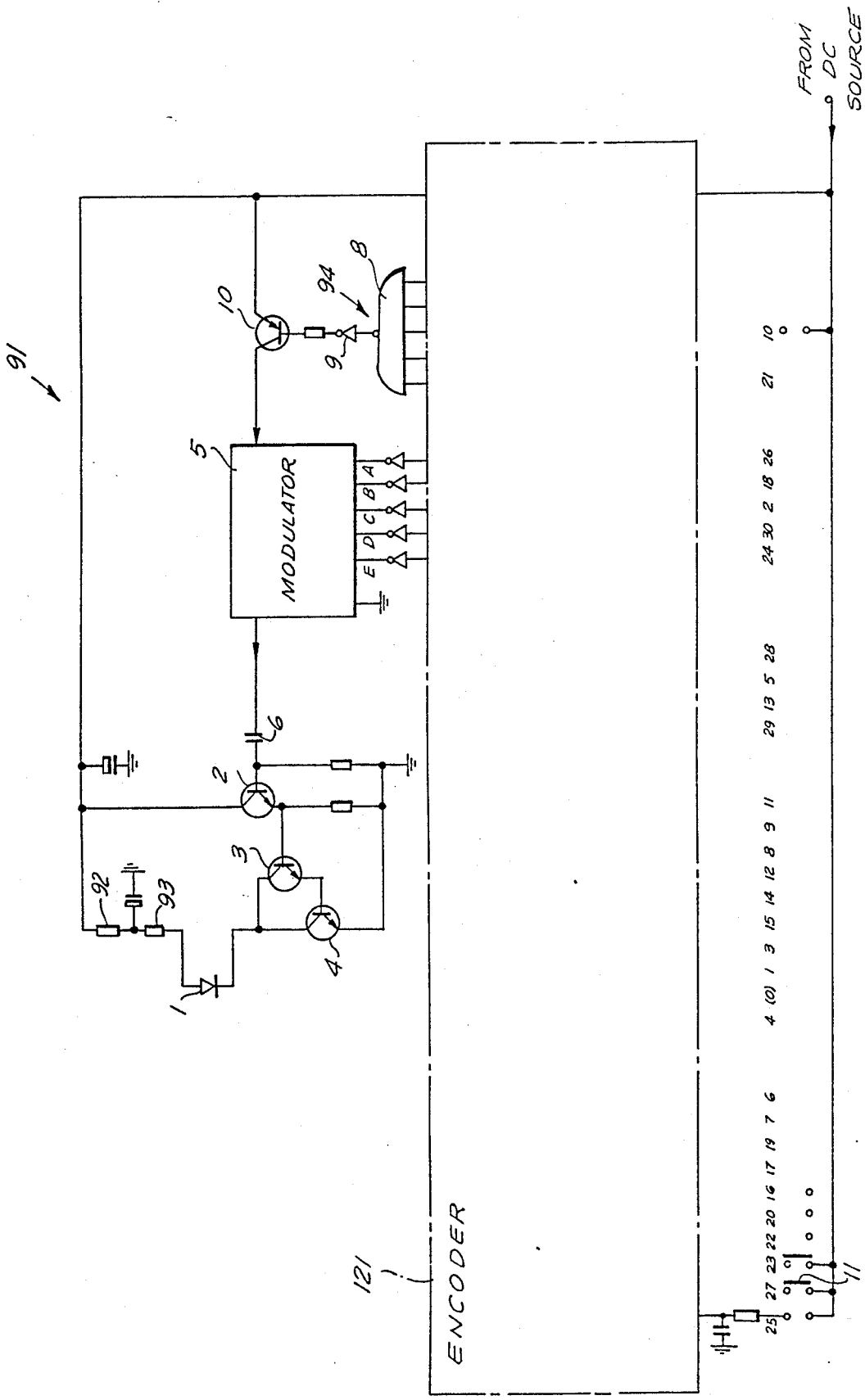
FIG. 1 is a combined block and schematic diagram of one embodiment of the transmitting portion of an infra-red remote command system constructed in accordance with the invention.

Referring now to the drawing, FIG. 1 depicts a general arrangement of a transmitter 91 of infra-red, PCM-modulated control pulses for effecting a channel-switching operation or similar regulation of a communications receiver, illustratively a TV set.

The transmitter includes a conventional infra-red emitting diode 1, illustratively a gallium arsenide diode, which is pulse-operated by high-frequency pulses whose format is determined by a pulse modulator 5 constructed in accordance with the invention and described below.

The output from the modulator 5 is coupled, via a capacitor 6, to a cascaded transistor driving arrangement 2, 3, 4, whose output connects the transmitting diode 1 across a suitable DC source through resistors 92 and 93.

The modulator 5 is energized by the same power source through a normally enabled switching transistor 10, which may be selectively disabled by a cutout circuit 94 as described below.

The input signals for the modulator 5 are represented on six parallel input lines A–F, five of which are shown in FIG. 1. Such signals represent the output of a conventional encoder 121, which converts one of a plurality of command signals, initiated by manually actuating one of a plurality of operating keys 11, 11 on the transmitter, to a repetitive five-digit binary encoded signal representing a given station or channel (illustratively 1–30). The sixth, highest order digit on line F may illustratively be employed for the remote control of more than one communications receiver, i.e., for the selection of channels on two separate receivers or the selection of channels on a television receiver and a selection of stations on a radio receiver; the state of such highest order digit is in such case used to indicate which of the receivers is to be controlled.

The cutout switch 94 includes a coincidence gate 8 coupled to the five lowest order output lines A–E of the encoder 101. When none of the keys 11 is actuated by an operator, the state of the output lines A–E from the encoder illustratively exhibit the same state, e.g., a binary "one". In this condition, the gate 8 transmits a signal to the base of the switching transistor 10 via an inverter 9, thereby decoupling the modulator 5 from the power supply for the conservation of energy.

Figure 2:
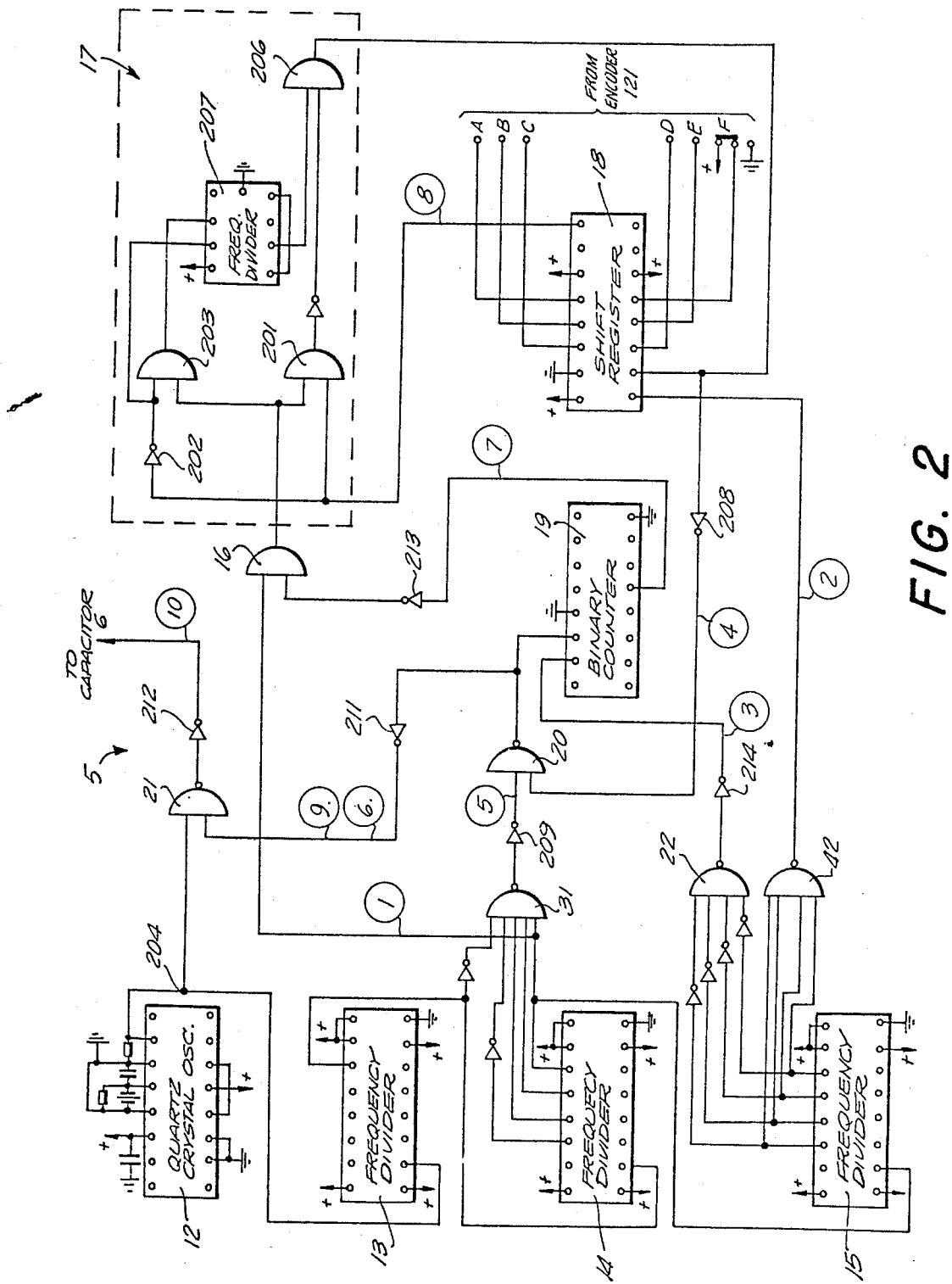
FIG. 2 is a combined block and schematic diagram of a portion of the arrangement of FIG. 1.
Figure 3:
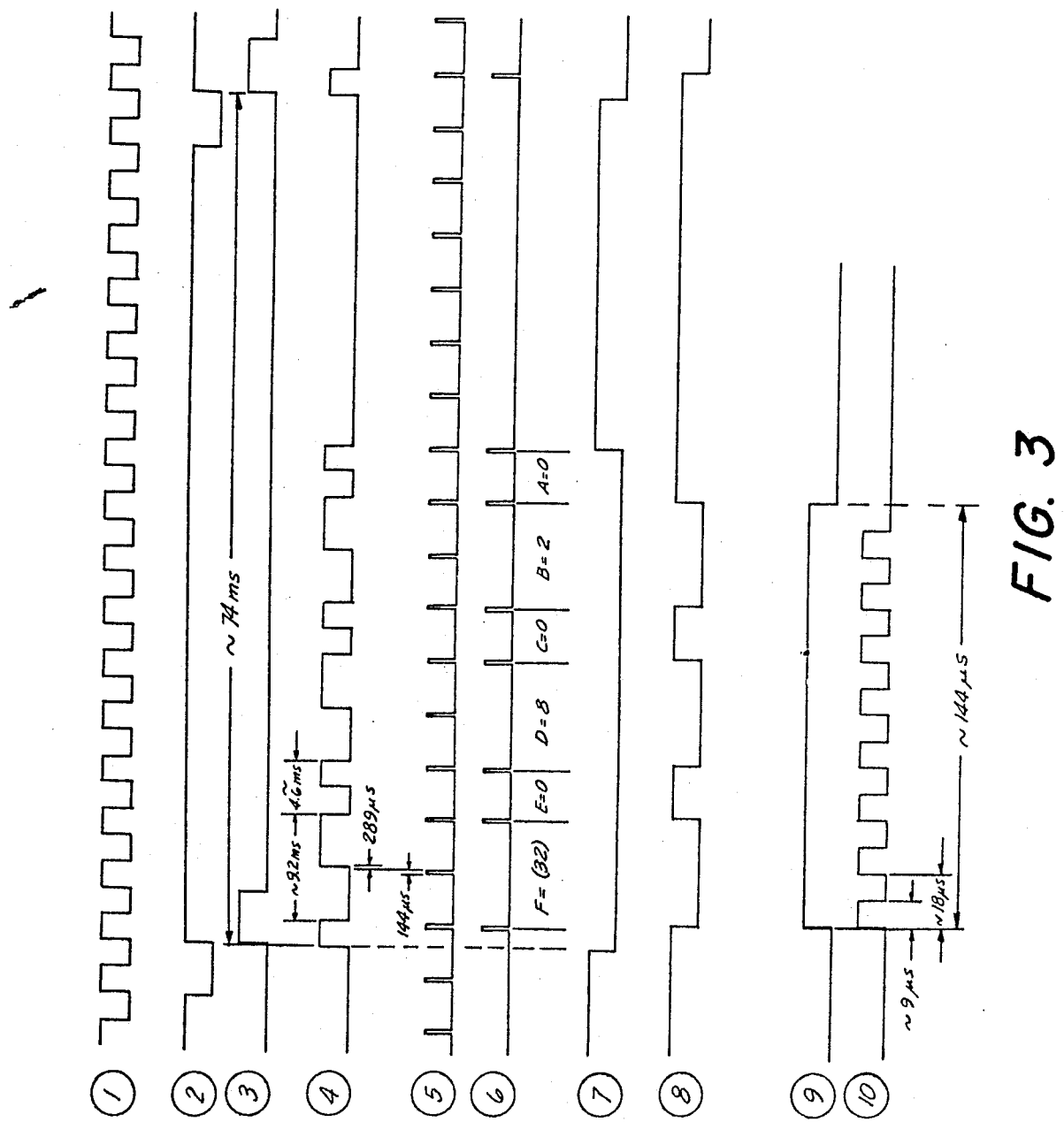
FIG. 3 is a series of curves illustrating pulse waveforms at different portions of the arrangement of FIGS. 1 and 2.

An illustrative arrangement of the modulator 5, together with a representation of the pulse waveforms at various points of the modulator, are depicted in FIGS. 2 and 3. The modulator 5 includes facilities for converting the repetitive binary-encoded command signals coming from the encoder 103 and present on lines A–F into a corresponding succession of pulses, the intervals of which are modulated in accordance with the binary coding of the input pulses.

The modulator 5 converts successively lower order digits on the lines A–F from the encoder to an interval-modulated pulse sequence in the manner shown in line 6 of FIG. 3. In such pulse sequence, a binary "zero" occurring in one of the incoming digits is converted to a predetermined basic interval (e.g., 4.6 ms) between a corresponding pair of pulses, while a binary "one" on an incoming line exhibits an interval, between the corresponding pair of pulses, of a multiple (e.g., 2) of the basic interval. Thus, in line 6 of FIG. 3, which is assumed to correspond to an input 6-digit binary quantity 101010, the spacing between the pairs of pulses representing the digits A, C and E is 4.6 ms, while the spacing between the pulses representing the digits B, D and F is 9.2 ms.

In order to obtain the indicated conversion from the binary quantity to the pulse sequence on line 6, the six input lines A–F from the encoder 121 are applied to corresponding inputs of a shift register 18 (FIG. 2) in the modulator 5. A corresponding output, indicated Q, of the shift register 18 is applied directly to a first input of a gate 201 in a PCM section 17, and through an inverter 202 to a corresponding first input of a gate 203.

Corresponding second inputs of the gates 201, 203 are excited from the output of a normally enabled gate 16 in the form of a succession of 50% duty cycle clock pulses at the basic 4.6 ms rate represented at line 1 of FIG. 3.

The 4.6 ms clock pulses are derived from a frequency controlled quartz crystal oscillator 12, which has a basic operating frequency of 4.433619 Mhz. After an initial division, within the oscillator unit 12, of 1:80 to yield an output transmission frequency of 55.42 Khz on an output line 204, the oscillator output is applied to a chain of 1:16 frequency dividers 13, 14, 15. An output D of the frequency divider 14, which exhibits the 4.6 ms pulse sequence shown in diagram 1 of FIG. 3, is coupled to the normally enabled gate 16 as indicated above. The sequence on line 1 is coupled through the gate 201, an inverter 205 and an additional gate 206 to a clock input of the shift register 18. Such sequence is also coupled to the gate 206 via an alternate path including a 1:2 frequency divider 207, depending on the output state of the shift register 18.

The output of the frequency divider 15, which provides a command word interval of 74 ms as shown in line 2 of FIG. 3, is coupled via a gate 42 to a reset input of the register 18. Since the register 18 is timed by the 4.6 ms pulses indicated in line 1 of FIG. 3, the output Q of the shift register responds to the assumed binary word 101010 on the lines A–F to yield the sequence of pulses indicated at line 8 of FIG. 3. The reset pulse for the register 18 is indicated at line 2 of FIG. 3.

With this arrangement, the normal occurrence of a relatively positive signal on the output Q of the shift register 18 will cause the 4.6 ms clock pulses at the output of the gate 16 to be routed directly, via the gate 201 and the inverter 205, to the gate 206. When the output Q is switched to exhibit a relatively negative signal (e.g., when the corresponding one of the digits A–F applied to the shift register exhibits a binary "1"), the 4.6 ms pulses will be routed to the gate 206 through the gate 203 and the 1:2 divider 207. The output of the gate 206 (represented at line 4 of FIG. 3), will thus be a PCM sequence of 4.6 ms and 9.2 ms pulses, with the former representing the occurrence of a binary "zero" and the latter representing the occurrence of a binary "one".

The chain of pulses on line 4 of FIG. 3 are also applied, via an inverter 208, to a first input of a gate 20. A second input of the gate 20 is responsive to a sequence of pulses indicated at line 5 in FIG. 3. Such pulses have a duration short with respect to the duration of the base 4.6 ms pulses (e.g., 144 microseconds), but have a repetition interval established by the 4.6 ms clock. For this purpose, four outputs of the frequency divider 14 are illustratively combined with an output of the frequency divider 13 via a gate 31, and the output of the gate 31 is applied to the appropriate input of the gate 20 via an inverter 209. The output of the gate 20 is in the form of a PCM sequence of 144 microsecond pulses shown at line 6 of FIG. 3 and corresponding to the coding on line 4.

The pulse sequence at the output of the gate 20 is applied directly to a count input of a binary counter 19, and through an inverter 211 to a first input of a gate 21. The other input of the gate 21 is coupled to the continuous 55.42 Khz sequence of pulses on output line 204 of the quartz crystal oscillator 12. In the gate 21, each of the 144 microsecond pulses shown on line 6 of FIG. 3 is employed to key six cycles of the 55.42 Khz wave emitted from the oscillator 12, as indicated at lines 9 and 10 of FIG. 3.

The output of the gate 21 is coupled to the output of the modulator 5 via an inverter 212. Such output is applied to the transmitting diode 1 via the transistor stages 2, 3 and 4.

The binary counter 19 is adapted to inhibit further transmission of the 4.6 ms clock pulses through the gate 16 and into the PCM stage 17 when a predetermined number of pulses in the sequence represented at line 6 of FIG. 3 has been applied to the count input of the counter 19. The number of pulses counted is determined by the number of digits in the incoming binary word; for the six digit word shown, a total of seven pulses during each of the command word pulse intervals of 74 ms shown at line 2 of FIG. 3, are counted. At the conclusion of the seventh pulse, the output of the counter 19, represented at line 7 of FIG. 3, is employed to disable the gate 16 through an inverter 213. Any disturbance pulses which occur during the remainder of the 74 ms word interval are not processed by the transmitter.

The 74 ms output of the frequency divider 15 is also applied, through an inverter 214, to a reset input of the counter 19. Such reset pulse, represented at line 3 of FIG. 2, is generated in a manner similar to the shift register reset pulse on line 2; the trailing edge of the shift register reset pulse on line 2 coincides with the leading edge of the counter reset pulse on line 3. The first pulse of the sequence on line 6 occurs during the counter reset interval, and is therefore not counted by the counter 19.

It will be seen from the above that the controlled oscillator 12 is responsible for generating three basic quantities for the infra-red transmitter: (1) the basic 4.6 ms clock pulse sequence shown on line 1, which establishes the base pulse spacing for the coded pulses on line 6; (2) the 74 ms gate pulse representing the repetition interval of the shift register and thereby the maximum permissible length of the transmitted code word; and (3) the 144 microsecond high-frequency pulse sequence to be transmitted by the infra-red diode 1.

Figure 4:
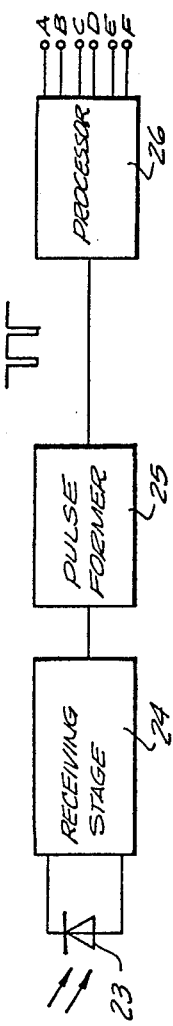
FIG. 4 is a combined block and schematic diagram of a generalized receiving portion of the infra-red remote command arrangement constructed in accordance with the invention.
Figure 5:
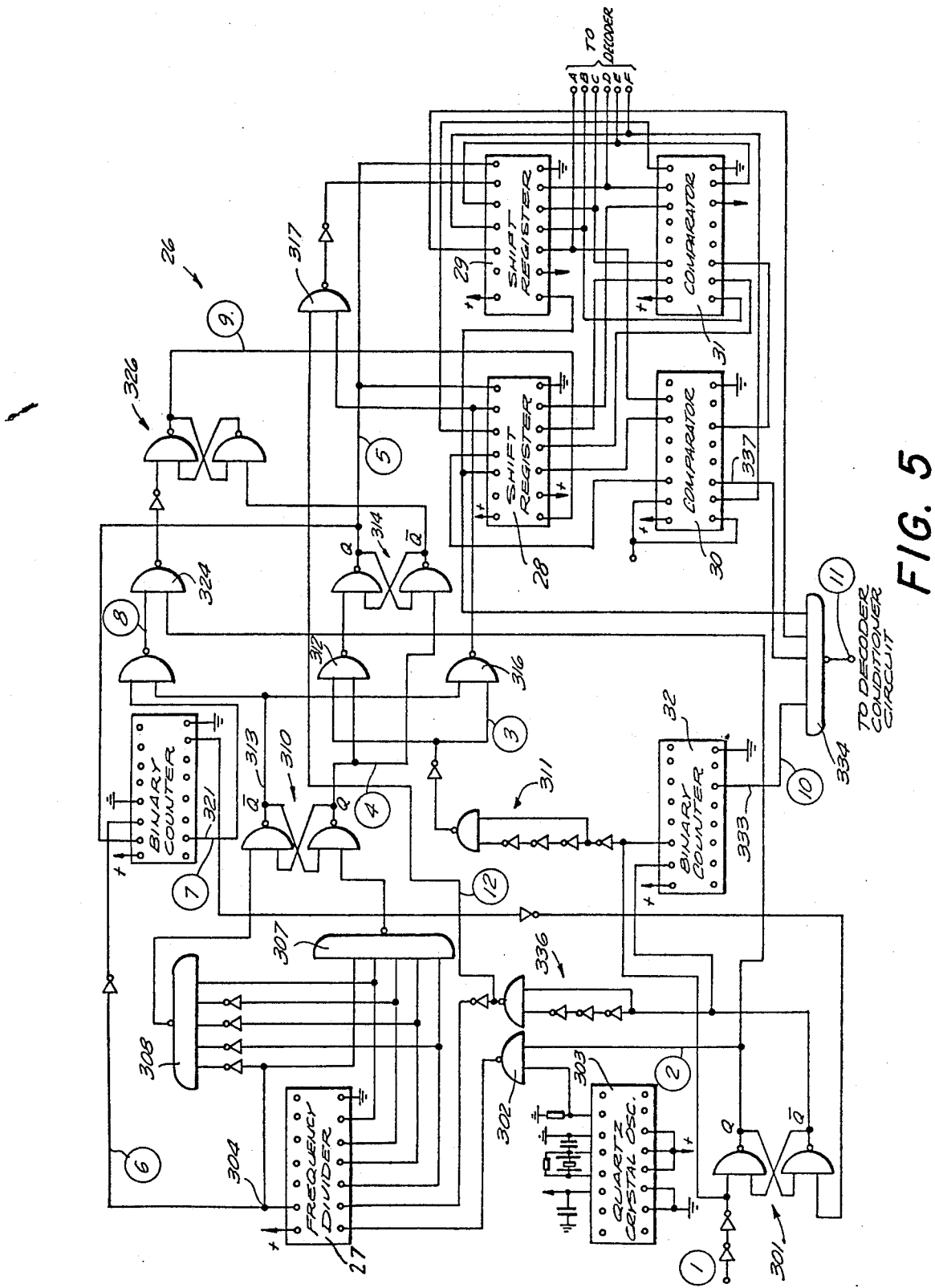
FIG. 5 is a combined block and schematic diagram of an encoded pulse processor suitable for use in the arrangement of FIG. 4.

In accordance with the invention, a frequency controlled quartz crystal oscillator that establishes chains of pulses identical to those in the transmitter 91 is provided in the receiving portion of the infra-red remote command system shown in FIGS. 4–5. Such chains of pulses are triggered upon the detection of a first pulse of the burst shown at line 6 of FIG. 3. In further accordance with the invention, an extremely narrow window (e.g., 288 microseconds) is generated during the occurrence of each of the re-generated 4.6 ms clock pulses in the receiver, into which windows each pulse of the 7-pulse sequence shown in line 6 of FIG. 3 must fall in order to be further processed in the receiver. Because of such narrow window, only the desired encoded command keyed by manual actuation of the key 11 of FIG. 1 will be decoded to effect the desired regulation function at the receiver, and all other pulses will be rejected.

The receiving portion of the infra-red control arrangement of the instant invention will now be described in further detail. The high-frequency modulated infra-red pulses from the transmitting diode 1 are received by a silicon photodiode 23 (FIG. 4), whose output is coupled via a conventional receiving stage 24 and pulse former 25 (illustratively a Schmitt trigger) to the input of a signal processor 26 constructed in accordance with the invention. The function of the processor 26 is to reproduce the 6-digit binary encoded command signal applied to the modulator 5 of FIG. 2, such reproduced quantity being applied via corresponding receiver output leads A–F (FIG. 4) to a conventional decoder (not shown). Such decoder in turn generates a suitable number of pulses for regulating the channel switching or other receiver function to be controlled.

Figure 6:
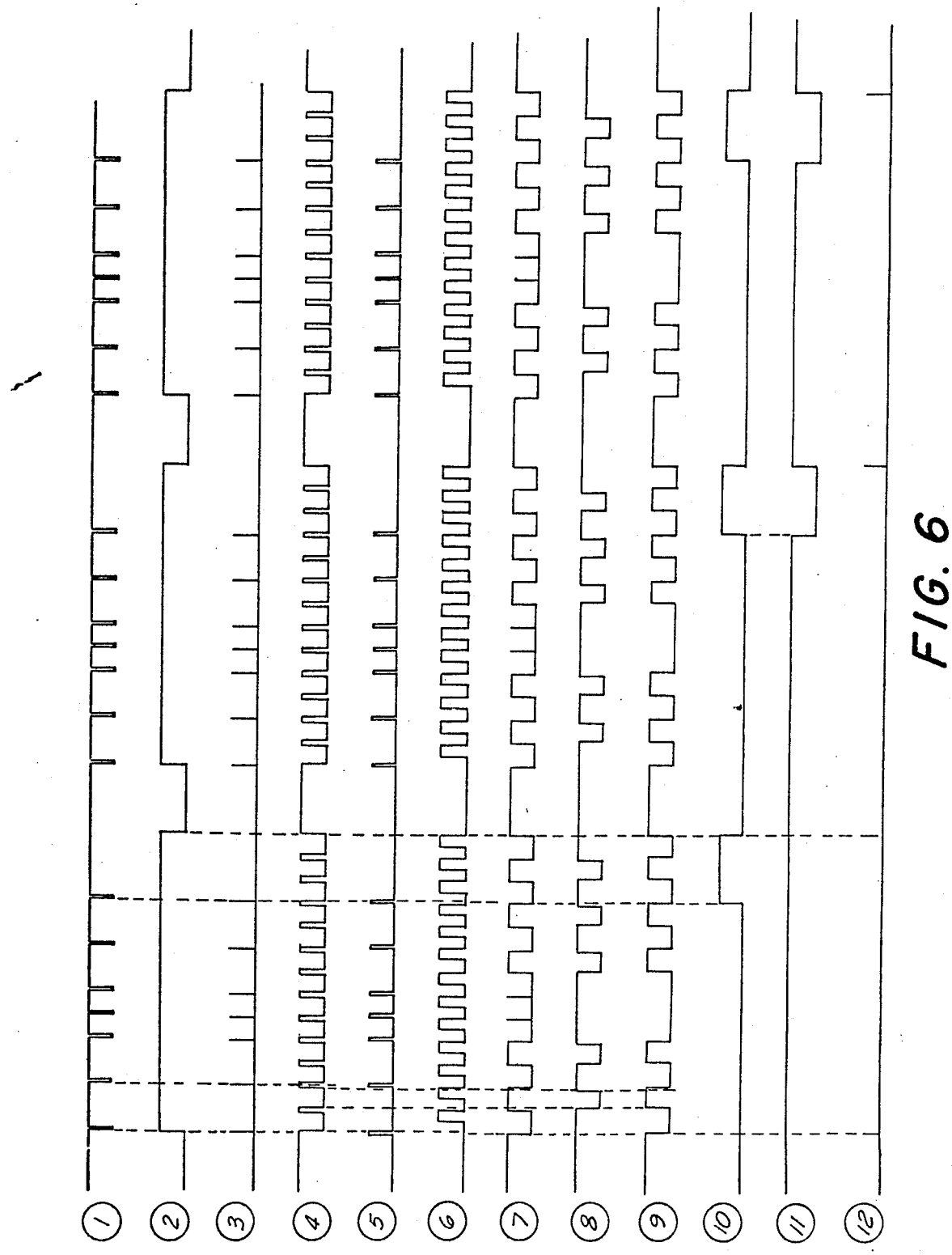

The processor 26 of FIG. 4 is illustrated in more detail in FIG. 5. The detected high-frequency encoded pulse train represented at line 1 of FIG. 6 is applied to a set input of a first flip-flop 301. The first pulse in the 7-pulse received sequence sets the flip-flop 301 to initiate a word pulse shown in line 2 of FIG. 6.

The output pulse of the flip-flop 301 is applied to one input of a gate 302. The other input of the gate 302 is supplied from the output of a frequency controlled quartz crystal oscillator 303, which has an identical output frequency (4.433619 Mhz) as does the oscillator 12 in the transmitter 91 (FIG. 2). The oscillator 303 is provided with facilities for dividing the basic crystal frequency by a ratio of 1:1280, such facilities being represented by a frequency divider 27. The divider 27 is further provided with a 1:16 additional division stage having an output on line 304, such output exhibiting a chain of pulses having the base 4.6 ms repetition rate. As indicated in line 6 of FIG. 6, the chains of pulses from the divider 27 commence upon the occurrence of the first pulse of the 7-pulse encoded sequence on line 1.

Figure 7:
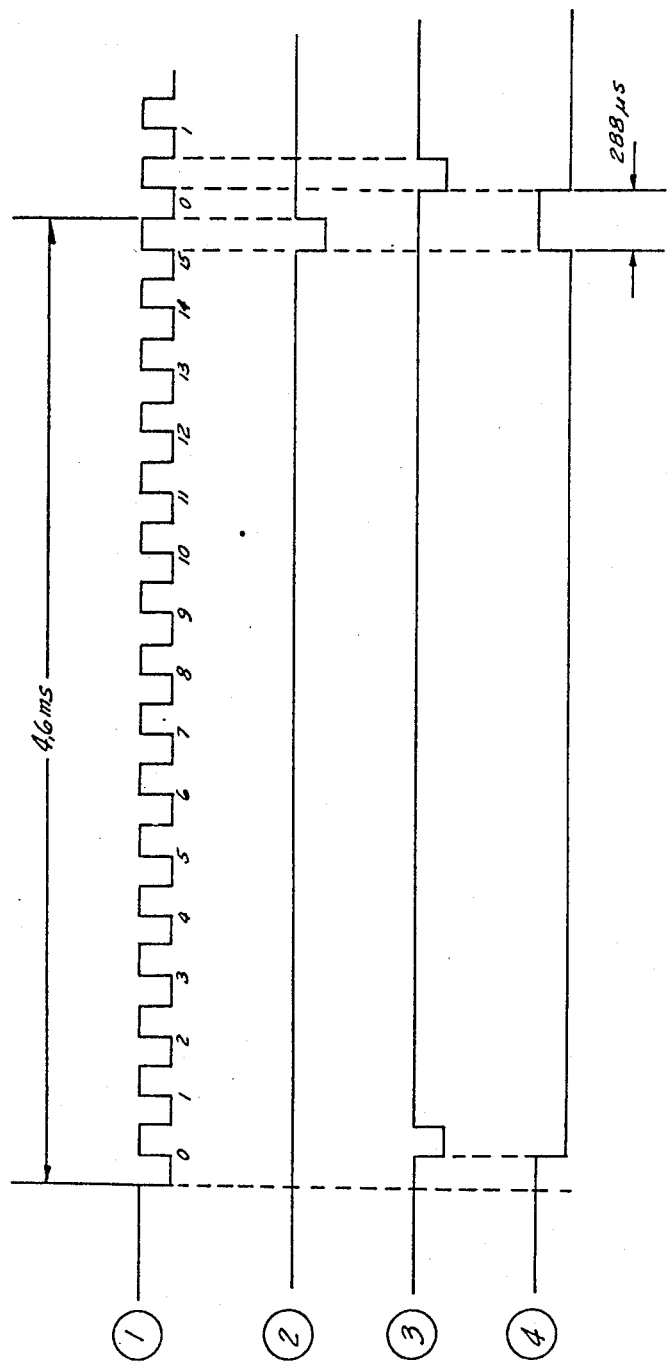
FIGS. 6 and 7 are series of curves illustrating pulse waveforms at various portions of the processor of FIG. 5.

The high-frequency output (e.g., the 1:1280 output) of the frequency divider 27 is represented by the chain of 0.3 ms pulses shown on line 1 of FIG. 7. This chain of pulses is applied, along with the 4.6 ms pulses on the auxiliary output 304 of the divider, to a pair of decoders 307 and 308.

The decoder 307 operates on the several inputs applied thereto to generate, during each repetition interval of the 4.6 ms base pulses, a trigger pulse shown on line 2 of FIG. 7. Such pulse occurs upon the appearance of the 15th pulse of the 16-pulse sequence of the 0.3 ms pulses in each 4.6 ms repetition interval.

In like manner, the decoder 308 operates on the pulse quantities supplied thereto from the divider 27 to generate, during each interval of the 4.6 ms base pulses, an additional trigger pulse shown on line 3 of FIG. 7, such pulse occurring upon the appearance of the 16th pulse of the 16-pulse sequence of 0.3 ms pulses.

The output of the decoder 307 is applied to the set input of a flip-flop 310 to initiate a 288 microsecond "window", during each cycle of the 4.6 ms pulses, through which each of the information-encoded pulses shown on line 1 of FIG. 6 and applied to the first flip-flop 301 must pass in order for the incoming signal to be ultimately decoded. The window pulse is shown at line 4 of FIG. 7; the termination of the window pulse is provided for by applying the output of the decoder 308 to the reset input of the flip-flop 310.

With this arrangement, any disturbance pulses, (e.g., infra-red sound transmission occurring in the vicinity of the remote command system at times other than the narrow intervals established by the window) will be rejected by the processor as indicated below.

The incoming pulses at the set input of the flip-flop 301 are also applied via a differentiating stage 311 to a first input of a gate 312. The "window" output of the flip-flop 310 is applied to the other input of the gate 312.

In the event that all of the pulses in the sequence incident at line 1, FIG. 6 coincide with the window pulses, such sequence will be applied, from the output of the gate 312 to suitable clock inputs of a pair of shift registers 28 and 29 via a flip-flop 314. The sequence on the output of the flip-flop 314 is shown at line 5 of FIG. 6. The registers 28 and 29 are conventionally programmed to provide the binary encoded outputs A–F for further decoding.

On the other hand, the occurrence of any pulse in the sequence on line 1 of FIG. 6 falling outside the corresponding window established by the flip-flop 310 (e.g., appearing on an output 313 thereof), are applied, via complementary output 315 and gate 316, to corresponding reset inputs of the shift registers 28 and 29, the latter through gate 317; as a result, such registers will be disabled until the receipt of the next encoded sequence on the line 1 of FIG. 6. As noted, one input of such gate 316 is coupled to the pulse chain on line 1 of FIG. 6, while the other input of the gate 316 is coupled to the complementary output 315 of the flip-flop 310.

In order to convert the received 144 microsecond-duration pulses to a chain of 1:2 PCM pulses corresponding to the pulse sequence on the line 4 of FIG. 3, the 4.6 ms chain of pulses on the output 304 of the frequency divider 27 (FIG. 5) are applied to a counting input of a counter 41. A reset input of the counter 41 is excited by the principal output of the flip-flop 314. The resulting chain of pulses at output 321 of the counter 41 has the form shown in line 7 of FIG. 3, exhibiting a pulse interval spacing of 4.6 ms when the corresponding binary quantity is "zero" and a repetition interval of twice such quantity, e.g., 9.2 ms, when the corresponding binary quantity is "one".

A pair of gates 323 and 324 are connected in tandem with the output of the counter 41 for eliminating disturbance pulses, shown in line 7 of FIG. 6, which arise at the output of the counter 41 because of inevitable time shifts between the 4.6 ms chain applied to the count input of the counter and the reproduced encoded chain applied to the reset input thereof. In particular, one input of the gate 323 is coupled to the output of the counter 41, and the complementary output 315 of the window-forming flip-flop 310 is applied to the other input of the gate 323. The output of such gate is represented at line 8, FIG. 6. The slight loss of information input represented by the operation of the gate 323 is restored by applying, to an auxiliary input of the gate 324, the output pulse from the flip-flop 301.

The output of the gate 324 is applied to a set input of a flip-flop 326. The complementary output of the flip-flop 314 is applied to the reset input of the flip-flop 326. The output of the flip-flop 326, shown at line 9 of FIG. 6, is applied to an information input of the shift register 28.

In order to reproduce the 74 millisecond word pulse, the 4.6 ms pulses at the output 304 of the divider 304 are counted for a suitable interval in the counter 41, and at the end of such interval are coupled via an auxiliary output 327 of the counter 41 to the reset input of the input flip-flop 301. Such reset pulse terminates the word pulse shown at line 2 of FIG. 6.

The incoming chain of pulses at line 1, FIG. 6 are also counted in an auxiliary counter 32, which is reset by the pulses appearing on the complementary output of the flip-flop 301. The output of the counter 32, appearing on a line 333 thereof, is arranged to be excited only when 7 encoded bits are present in each word interval of 74 ms. Such output of the counter 32 is applied to one input of a coincidence gate 334, whose output is applied to a suitable conditioning input of the system decoder (not shown), whereby such decoder will be conditioned for operation only when an output occurs on the output of such gate 334.

The complementary output of the input flip-flop 301 is also employed to reset the shift registers 28 and 29. For this purpose, such output, after differentiation in a stage 336, is applied to a second input of the gate 317.

An additional safeguard against erroneous information is accomplished by serially feeding two successive encoded sequences applied to the receiver into individual ones of the shift registers 28 and 29. A pair of comparators 30 and 31 are coupled to the output of the registers 28 and 29. When the compared words agree, as manifested by an output on line 341 of the comparator 30, a second input of the gate 334 will be excited. In order to make sure that the two successive code words fed into the registers 28 and 29 correspond to command signals for the same receiver (as manifested by corresponding states in the highest order digit), a pair of auxiliary outputs of the shift registers 28 and 29, which exhibit the state of such digits are applied to separate additional inputs of the gate 334.

Only when the four inputs of the gate 334 are simultaneously excited does the gate 334 permit the decoding of the output binary digits A–F of the processor 26.

In the foregoing, an illustrative arrangement of the invention has been described. Many variations and modifications will now occur to those skilled in the art. It is accordingly desired that the scope of the appended claims not be limited to the specific disclosure herein contained.

What is claimed is:

1. In a remote command system for regulating a prescribed function of at least one communication receiver in accordance with one of a plurality of selected manual commands, command sending means including an infrared transmitting element, resettable command reproduction means disposed at the receiver and including an infra-red detecting element, first frequency controlled oscillator means associated with the command sending means for generating a first pulse sequence at a first rate, first dividing means coupled to the first oscillator means for generating a second pulse sequence at a second rate corresponding to a sub-multiple of the first rate, first resettable means responsive to the selected manual command signal for encoding the pulse interval of the second pulse sequence to form a third pulse sequence, first means responsive to the output of the first encoding means for modulating the first pulse sequence to form a fourth pulse sequence, means for applying the fourth pulse sequence to the transmitting element for radiation to the detecting element of the command reproducing means, second frequency controlled oscillator means associated with the reproducing means for generating a fifth pulse sequence identical to the first pulse sequence at the first rate, second dividing means coupled to the second oscillator means and normally responsive to the detected fourth pulse sequence for generating a sixth pulse sequence identical to the second pulse sequence at the second rate upon the detection of the first pulse of the fourth pulse sequence, and means including checking means responsive to the detected fourth pulse sequence for encoding the repetition interval of the sixth pulse sequence to yield a seventh pulse sequence decodable to reproduce the selected command.

2. A system as defined in claim 1, in which the first encoding means comprises means for switching each interpulse interval of the second pulse sequence between a base interval corresponding to the second rate and a multiple of said base interval.

3. A system as defined in claim 2, in which the multiple is equal to 2.

4. A system as defined in claim 1, in which the checking means comprises, in combination, third dividing means coupled to the output of the second oscillator means and the second generating means for generating, at the second rate, an eighth sequence of window-forming pulses individually occurring at a predetermined portion of the cycle of each pulse in the sixth pulse sequence, first coincidence means having first and second inputs, means for applying the detected fourth pulse sequence to the first input of the first coincidence means, means for applying the eighth pulse sequence to the second input of the first coincidence means, the output of the first coincidence means defining a resulting ninth pulse sequence, and means for varying the repetition interval of the sixth pulse sequence in accordance with the ninth pulse sequence.

5. A system as defined in claim 4, further comprising means rendered effective upon a non-coincidence of successive pulses of the fourth pulse sequence and the successive window-forming pulses of the eighth pulse sequence for resetting the reproducing means.

6. A system as defined in claim 4, in which the first modulating means comprises, in combination, third dividing means coupled to the first generating means for generating, at the second rate, a ninth sequence of pulses having a duration short with respect to the duration of each pulse in the second sequence, second coincidence means having first and second inputs, means for coupling the output of the first encoding means to the first input of the second coincidence means, and means for coupling the output of the third generating means to the second input of the second coincidence means, the output of the second coincidence means defining the fourth pulse sequence.

7. A system as defined in claim 6, further comprising first and second storage means for registering a pair of successive ninth pulse sequences, and comparison means coupled to the outputs of the first and second storage means for outpulsing a signal upon an identity of the quantity stored in the first and second storage means.

8. A system as defined in claim 6, further comprising fourth dividing means coupled to the first generating means for generating a tenth pulse sequence at intervals long with respect to the interval corresponding to the second rate to frame a succession of word intervals, and first means responsive to the occurrence of each pulse in the tenth pulse sequence for resetting the first encoding means.

9. A system as defined in claim 8, further comprising first resettable counting means having a count input, means for coupling the ninth sequence of pulses to the count input of the first counting means, and second means responsive to the occurrence of each pulse in the tenth pulse sequence for resetting the first counting means.

10. A system as defined in claim 9, in which the first counting means has an output exhibiting a pulse when a predetermined number of pulses have been counted at the count input thereof, and in which the first encoding means comprises, in combination, third coincidence means having first and second inputs, means for applying the fourth pulse sequence to the first input of the third coincidence means, and means for coupling the output of the first counting means to the second input of the third coincidence means for inhibiting operation of the first encoding means at the conclusion of the predetermined number of pulses in the fourth pulse sequence.

11. A system as defined in claim 10, in which the means for applying the detected fourth pulse sequence to the first input of the first coincidence means includes means for differentiating the pulses in the detected fourth pulse sequence.

12. A system as defined in claim 10, in which the second encoding means comprises, in combination, resettable second counting means having a count input and a first output, means for applying the sixth pulse sequence to the count input of the second counting means, and means responsive to the eighth pulse sequence for resetting the second counting means, the first output of the second counting means defining the ninth pulse sequence.

13. A system as defined in claim 12, further comprising third resettable counting means having a count input and an output exhibiting a pulse when a predetermined number of pulses have been counted at the count input thereof, and means for applying the detected fourth pulse sequence to the count input of the third counting means.

14. A system as defined in claim 13, in which the second counting means has a second output exhibiting a pulse when a second predetermined number of pulses have been applied to the count input thereof, and in which the system further comprises means responsive to the second output of the second counting means for resetting the third counting means.

* * * * *